(12) United States Patent
Shen et al.

(10) Patent No.: US 10,361,815 B2
(45) Date of Patent: Jul. 23, 2019

(54) POLAR CODE RATE MATCHING METHOD AND APPARATUS

(71) Applicant: Huawei Technologies Co., Ltd., Shenzhen, Guangdong (CN)

(72) Inventors: Hui Shen, Shenzhen (CN); Bin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 63 days.

(21) Appl. No.: 15/270,250

(22) Filed: Sep. 20, 2016

(65) Prior Publication Data

US 2017/0012739 A1 Jan. 12, 2017

Related U.S. Application Data

(63) Continuation of application No. PCT/CN2014/073845, filed on Mar. 21, 2014.

(51) Int. Cl.
| | |
|---|---|
| *H04L 1/00* | (2006.01) |
| *H03M 13/00* | (2006.01) |
| *H03M 13/13* | (2006.01) |
| *H03M 13/27* | (2006.01) |

(52) U.S. Cl.
CPC .......... *H04L 1/0067* (2013.01); *H03M 13/13* (2013.01); *H03M 13/2757* (2013.01); *H03M 13/6306* (2013.01); *H03M 13/6362* (2013.01); *H04L 1/00* (2013.01); *H04L 1/0041* (2013.01); *H04L 1/0057* (2013.01); *H04L 1/0071* (2013.01)

(58) Field of Classification Search
CPC ... H04L 1/0067; H04L 1/0057; H04L 1/0071; H04L 1/0041; H04L 1/00; H03M 13/13; H03M 13/6362; H03M 13/6306; H03M 13/2757

See application file for complete search history.

(56) References Cited

U.S. PATENT DOCUMENTS

| | | |
|---|---|---|
| 2003/0167436 A1 | 9/2003 | Ha et al. |
| 2006/0156199 A1 | 7/2006 | Palanki et al. |
| 2007/0189151 A1 | 8/2007 | Pan et al. |
| 2008/0307293 A1 | 12/2008 | Cheng |

(Continued)

FOREIGN PATENT DOCUMENTS

| | | |
|---|---|---|
| CN | 1520045 A | 8/2004 |
| CN | 101060338 A | 10/2007 |

(Continued)

OTHER PUBLICATIONS

Motorola, "Circular Buffer Rate Matching for HUGE and RED HOT", 3GPP TSG GERAN #34, May 14-18, 2007, 8 pages.

(Continued)

*Primary Examiner* — Thien Nguyen

(57) ABSTRACT

A polar code rate matching method and apparatus are provided. The method includes: performing bit reversal order interleaving on a polar code output by a polar code encoder, to obtain interleaved bits; and determining, based on the interleaved bits, a rate-matched output sequence. By performing bit reversal order interleaving on a polar code, a rate-matched output sequence is obtained, which can reduce an FER, thereby improving HARQ performance and ensuring reliability of data transmission.

11 Claims, 5 Drawing Sheets

(56) References Cited

U.S. PATENT DOCUMENTS

| | | |
|---|---|---|
| 2009/0092118 A1 | 4/2009 | Naka et al. |
| 2009/0296850 A1 | 12/2009 | Xu et al. |
| 2009/0327843 A1 | 12/2009 | Palanki et al. |
| 2011/0280186 A1* | 11/2011 | Rasquinha ........ H03M 13/275 370/328 |
| 2012/0185751 A1 | 7/2012 | Wang et al. |
| 2013/0091407 A1* | 4/2013 | Cheng ................. H03M 13/23 714/790 |
| 2013/0145239 A1 | 6/2013 | Pi et al. |
| 2013/0283116 A1 | 10/2013 | Arikan |
| 2015/0229337 A1* | 8/2015 | Alhussien ........... H03M 13/35 714/773 |

FOREIGN PATENT DOCUMENTS

| | | |
|---|---|---|
| CN | 101075857 A | 11/2007 |
| CN | 101076960 A | 11/2007 |
| CN | 101090293 A | 12/2007 |
| CN | 101119182 A | 2/2008 |
| CN | 101124731 A | 2/2008 |
| CN | 101836387 A | 9/2010 |
| CN | 101860412 A | 10/2010 |
| CN | 103023618 A | 4/2013 |
| EP | 1335497 A2 | 8/2003 |
| RU | 2407177 C2 | 12/2010 |
| TW | 201246803 A | 11/2012 |
| WO | 2011079633 A1 | 7/2011 |

OTHER PUBLICATIONS

Marco Mondelli et al., "From Polar to Reed-Muller Codes: a Technique to Improve the Finite-Length Performance", Jan. 1, 2014, 8 pages.

Erdal Arikan et al., "Channel polarization: A method for constructing capacity-achieving codes for symmetric binary-input memoryless channels", 2008, 23 pages.

Ido Tal et al., "List Decoding of Polar Codes", IEEE Transactions on Information Theory, vol. 61, No. 5, May 2015, p. 2213-2226.

Viveck R. Cadambe et al., "Interference Alignment and Spatial Degrees of Freedom for the K User Interference Channel", IEEE, 2008, p. 971-975.

* cited by examiner

POLAR CODE RATE MATCHING METHOD AND APPARATUS

CROSS-REFERENCE TO RELATED APPLICATIONS

This application is a continuation of International Application No. PCT/CN2014/073845, filed on Mar. 21, 2014, The disclosure of the above application is incorporated herein by reference.

TECHNICAL FIELD

Embodiments of the present invention relate to the codec field, and more specifically, to a polar code rate matching method and apparatus.

BACKGROUND

In a communications system, channel coding is generally used to improve reliability of data transmission, so as to ensure communication quality. A polar code (polar code) is an encoding manner that can achieve a Shannon capacity and has low coding-decoding complexity. The polar code is a linear block code. A generator matrix of the polar code is $G_N$, and an encoding process of the polar code is $x_1^N = u_1^N G_N$, where $G_N = B_N F^{\otimes n}$, a code length is $N = 2^n$, and $n \geq 0$.

Herein, $$F = \begin{bmatrix} 1 & 0 \\ 1 & 1 \end{bmatrix},$$

and $B_N$ is a transposed matrix, for example, a bit reversal (bit reversal) matrix.

$F^{\otimes n}$ is a Kronecker power (Kronecker power) of F, and is defined as $F^{\otimes n} = F \otimes F^{\otimes (n-1)}$. The polar code may be represented by a coset code $(N, K, A, u_{A^C})$, and an encoding process of the polar code is $x_1^N = u_A G_N(A) \oplus u_{A^C} G_N(A^C)$. Herein, A is a set of information (information) bit indexes, $G_N(A)$ is a sub-matrix obtained by using a row corresponding to an index in the set A in $G_N$, and $G_N(A^C)$ is a sub-matrix obtained by using a row corresponding to an index in a set $A^C$ in $G_N$. $u_{A^C}$ is frozen (frozen) bits, where a quantity of the frozen bits is (N−K), and the frozen bits are known bits. For simplicity, these frozen bits may be set to 0.

A conventional random (quasi-random) puncturing hybrid automatic repeat request (HARQ) technology may be used for the polar code. The so-called random (quasi-random) puncturing is randomly (quasi-randomly) selecting a location for puncturing. At a receive end, an LLR at a puncturing location is set to 0, and a mother code decoding module and method are still used. In this random (quasi-random) puncturing manner, a frame error rate is relatively high, and HARQ performance is relatively poor.

SUMMARY

Embodiments of the present invention provide a polar code rate matching method and apparatus, which can improve rate matching performance of a polar code.

According to a first aspect, a polar code rate matching method is provided, including: performing BRO interleaving on a polar code output by a polar code encoder, to obtain interleaved bits; and determining, based on the interleaved bits, a rate-matched output sequence.

With reference to the first aspect, in an implementation manner of the first aspect, the performing BRO interleaving on a polar code output by a polar code encoder, to obtain interleaved bits includes:
performing BRO interleaving on the polar code by using a BRO interleaver, to obtain the interleaved bits, where a length of input bits of the BRO interleaver is N, and the BRO interleaver maps the $i^{th}$ input bit onto the $\Pi(i+\Delta \bmod N)^{th}$ output bit, where $i = 0, 1, \ldots$, and N−1, $\Delta$ is an offset, $\Pi(i)$ is obtained from $BRO_M(j)$, $BRO_M(j)$ indicates that a bit reversal order operation is performed on an index j, and M is a positive integer.

With reference to the first aspect and the foregoing implementation manner of the first aspect, in another implementation manner of the first aspect, $\Pi(i)$ is defined as follows: $\Pi_B(j) = BRO_M(j)$, where
$j = 0, 1, \ldots$, and B−1, and B indicates a size of $\Pi_B(j)$.

With reference to the first aspect and the foregoing implementation manner of the first aspect, in another implementation manner of the first aspect, $\Pi(i)$ is obtained by means of pruning by $\Pi_B(j)$; and $\Pi_B(j) = 2^M(j \bmod J) + BRO_M(\lfloor j/J \rfloor)$, where $j = 0, 1, \ldots$, B−1, B indicates a size of the interleaver $\Pi_B(i)$, B = M×J, and J is a positive integer.

With reference to the first aspect and the foregoing implementation manners of the first aspect, in another implementation manner of the first aspect, the determining, based on the interleaved bits, a rate-matched output sequence includes: writing the interleaved bits or reversed bits of the interleaved bits into a circular buffer; determining a start location of the rate-matched output sequence in the circular buffer according to a redundancy version; and reading the rate-matched output sequence from the circular buffer according to the start location.

With reference to the first aspect and the foregoing implementation manners of the first aspect, in another implementation manner of the first aspect, the determining, based on the interleaved bits, a rate-matched output sequence includes: sequentially intercepting the interleaved bits or reversed bits of the interleaved bits to obtain the rate-matched output sequence; or repeatedly extracting the interleaved bits or reversed bits of the interleaved bits to obtain the rate-matched output sequence.

According to a second aspect, a rate matching apparatus is provided, including: a BRO interleaving unit, configured to perform BRO interleaving on a polar code output by a polar code encoder, to obtain interleaved bits; and a determining unit, configured to determine, based on the interleaved bits, a rate-matched output sequence.

With reference to the second aspect, in an implementation manner of the second aspect, a length of input bits of the BRO interleaving unit is N, and the BRO interleaving unit maps the $i^{th}$ input bit onto the $\Pi(i+\Delta \bmod N)^{th}$ output bit, where $i = 0, 1, \ldots$, and N−1, $\Delta$ is an offset, $\Pi(i)$ is obtained from $BRO_M(j)$, $BRO_M(j)$ indicates that a bit reversal order operation is performed on an index j, and M is a positive integer.

With reference to the second aspect and the foregoing implementation manner of the second aspect, in another implementation manner of the second aspect, $\Pi(i)$ is defined as follows: $\Pi_B(j) = BRO_M(j)$, where
$j = 0, 1, \ldots$, and B−1, and B indicates a size of $\Pi_B(j)$.

With reference to the second aspect and the foregoing implementation manner of the second aspect, in another implementation manner of the second aspect, Π(i) is obtained by means of pruning by $\Pi_B(j)$; and $$\Pi_B(j)=2^M(j \bmod J)+\mathrm{BRO}_M(\lfloor j/J \rfloor), \text{ where}$$

j=0, 1, ..., B−1, B indicates a size of the interleaver $\Pi_B(j)$, B=M×J, and J is a positive integer.

With reference to the second aspect and the foregoing implementation manners of the second aspect, in another implementation manner of the second aspect, the determining unit is specifically configured to: write the interleaved bits or reversed bits of the interleaved bits into a circular buffer; determine a start location of the rate-matched output sequence in the circular buffer according to a redundancy version; and read the rate-matched output sequence from the circular buffer according to the start location.

With reference to the second aspect and the foregoing implementation manners of the second aspect, in another implementation manner of the second aspect, the determining unit is specifically configured to: sequentially intercept the interleaved bits or reversed bits of the interleaved bits to obtain the rate-matched output sequence; or repeatedly extract the interleaved bits or reversed bits of the interleaved bits to obtain the rate-matched output sequence.

According to a third aspect, a wireless communications apparatus is provided, including a polar code encoder, the foregoing rate matching apparatus, and a transmitter.

According to the embodiments of the present invention, bit reversal order interleaving is performed on a polar code, to obtain a rate-matched output sequence, which can reduce an FER (Frame Error Rate, frame error rate), thereby improving HARQ performance and ensuring reliability of data transmission.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

Figure 1:
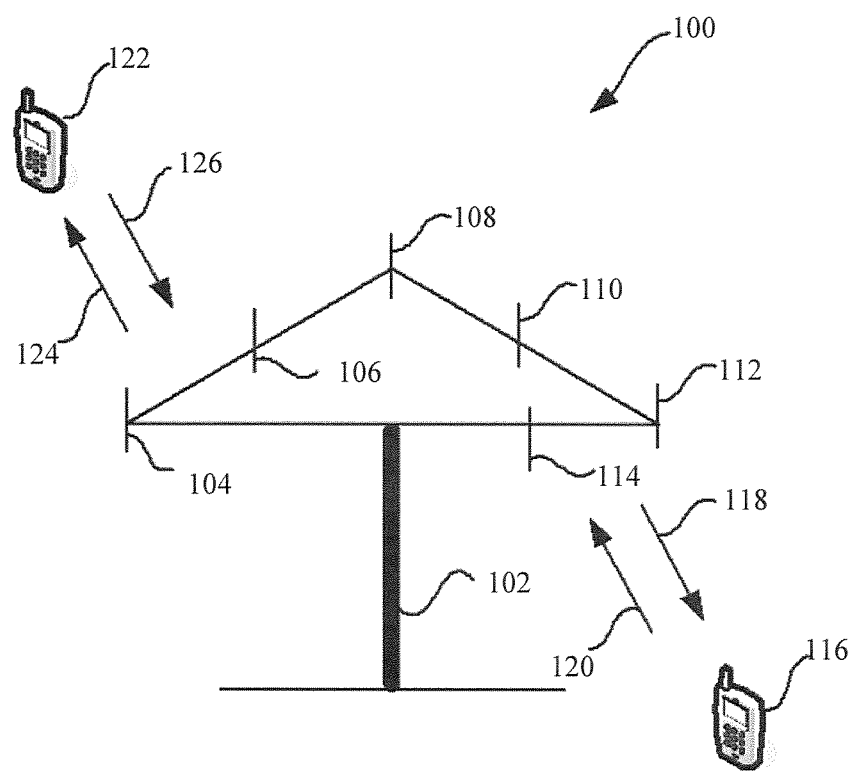
FIG. 1 shows a wireless communications system according to an embodiment of the present invention.

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

The embodiments of the present invention may be applied to various communications systems. Therefore, the following description is not limited to a specific communications system, for example, a Global System for Mobile Communications ("GSM" for short), a Code Division Multiple Access ("CDMA" for short) system, a Wideband Code Division Multiple Access ("WCDMA" for short) system, a general packet radio service ("GPRS" for short), a Long Term Evolution ("LTE" for short) system, an LTE frequency division duplex ("FDD" for short) system, an LTE time division duplex ("TDD" for short), or a Universal Mobile Telecommunications System ("UMTS" for short). Any information or data that is encoded and processed by a base station or terminal in the foregoing systems by using a conventional Turbo code and LDPC code can be encoded by using a polar code in the embodiments.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on the computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from two components interacting with another component in a local system, a distributed system, and/or across a network such as the Internet interacting with other systems by using the signal).

In addition, the embodiments are described with reference to an access terminal. The access terminal may also be referred to as a system, a subscriber unit, a subscriber station, a mobile site, a mobile station, a remote station, a remote terminal, a mobile device, a user terminal, a terminal, a wireless communications device, a user agent, a user apparatus, or a UE (User Equipment). The access terminal may be a cellular phone, a cordless phone, a SIP (Session Initiation Protocol) phone, a WLL (Wireless Local Loop) station, a PDA (Personal Digital Assistant), a handheld device having a wireless communication function, a computing device, or another processing device connected to a wireless modem. In addition, the embodiments are described with reference to a base station. The base station can be used to communicate with a mobile device; and the base station may be a BTS (Base Transceiver Station) in GSM (Global System of Mobile communication) or CDMA (Code Division Multiple Access), or may be an NB (NodeB, NodeB) in WCDMA (Wideband Code Division Multiple Access), or may further be an eNB or eNodeB (Evolutional Node B) in LTE (Long Term Evolution), a relay station or an access point, a base station device in a future 5G network, or the like.

In addition, aspects or features of the present invention may be implemented as a method, an apparatus or a product that uses standard programming and/or engineering technologies. The term "product" used in this application covers a computer program that can be accessed from any computer readable component, carrier or medium. For example, the computer-readable medium may include but is not limited to: a magnetic storage component (for example, a hard disk, a floppy disk or a magnetic tape), an optical disc (for example, a CD (Compact Disk), and a DVD (Digital Versatile Disk)), a smart card and a flash memory component (for example, EPROM (Erasable Programmable Read-Only Memory), a card, a stick, or a key drive). In addition, various storage media described in this specification may indicate one or more devices and/or other machine-readable media that are used to store information. The term "machine readable media" may include but is not limited to a radio channel, and various other media that can store, contain and/or carry an instruction and/or data.

Referring to FIG. 1, FIG. 1 shows a wireless communications system 100 according to the embodiments described in this specification. The system 100 includes a base station 102, where the base station 102 may include multiple antenna groups. For example, one antenna group may include antennas 104 and 106, another antenna group may include antennas 108 and 110, and an additional group may include antennas 112 and 114. Two antennas are shown for each antenna group. However, more or less antennas may be used for each group. The base station 102 may additionally include a transmitter chain and a receiver chain. A person of ordinary skill in the art may understand that both the transmitter chain and the receiver chain may include multiple components related to signal sending and receiving (for example, a processor, a modulator, a multiplexer, a demodulator, a demultiplexer, or an antenna).

The base station 102 may communicate with one or more access terminals (for example, an access terminal 116 and an access terminal 122). However, it may be understood that the base station 102 basically can communicate with any quantity of access terminals similar to the access terminals 116 and 122. The access terminals 116 and 122 may be, for example, a cellular phone, a smart phone, a portable computer, a handheld communications device, a handheld computing device, a satellite radio apparatus, a global positioning system, a PDA, and/or any other appropriate device configured to perform communication in the wireless communications system 100. As shown in the figure, the access terminal 116 communicates with the antennas 112 and 114, where the antennas 112 and 114 send information to the access terminal 116 by using a forward link 118, and receive information from the access terminal 116 by using a reverse link 120. In addition, the access terminal 122 communicates with the antennas 104 and 106, where the antennas 104 and 106 send information to the access terminal 122 by using a forward link 124, and receive information from the access terminal 122 by using a reverse link 126. In an FDD (Frequency Division Duplex, frequency division duplex) system, for example, the forward link 118 may use a different frequency band from the reverse link 120, and the forward link 124 may use a different frequency band from the reverse link 126. In addition, in a TDD (Time Division Duplex, time division duplex) system, the forward link 118 and the reverse link 120 may use a same frequency band, and the forward link 124 and the reverse link 126 may use a same frequency band.

Each group of antennas and/or areas designed for communication is referred to as a sector of the base station 102. For example, an antenna group may be designed to communicate with an access terminal in a sector of an area covered by the base station 102. During communication performed by using the forward links 118 and 124, a transmit antenna of the base station 102 may improve, by means of beamforming, signal-to-noise ratios of the forward links 118 and 124 for the access terminals 116 and 122. In addition, compared with sending, by a base station by using a single antenna, information to all access terminals of the base station, sending, by the base station 102 by means of beamforming, information to the access terminals 116 and 122 that are dispersed randomly in a related coverage area causes less interference to a mobile device in a neighboring cell.

In a given time, the base station 102, the access terminal 116, and/or the access terminal 122 may be a sending wireless communications apparatus and/or a receiving wireless communications apparatus. When sending data, the sending wireless communications apparatus may encode the data for transmission. Specifically, the sending wireless communications apparatus may have (for example, generate, obtain, or store in a memory) a particular quantity of information bits to be sent to the receiving wireless communications apparatus through a channel. The information bits may be included in a transport block (or multiple transport blocks) of data, and may be segmented to generate multiple code blocks. In addition, the sending wireless communications apparatus may encode each code block by using a polar code encoder (which is not shown).

Figure 2:
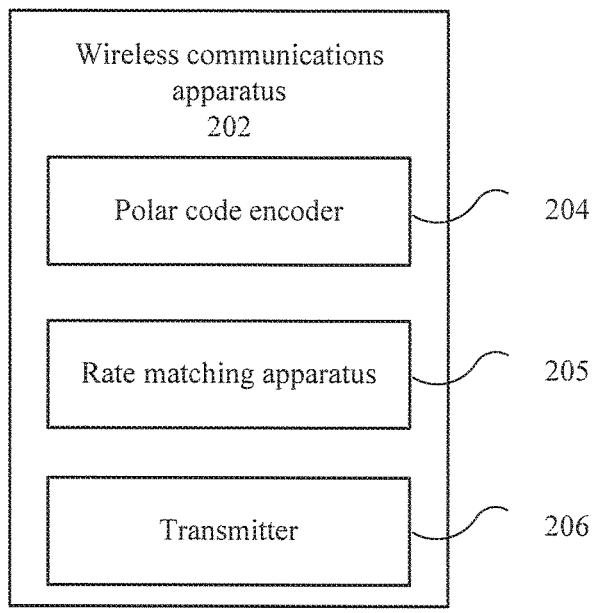
FIG. 2 shows a system for executing a polar code processing method in a wireless communications environment.

Now, proceeding to FIG. 2, FIG. 2 shows a system 200 for executing a polar code processing method in a wireless communications environment. The system 200 includes a wireless communications apparatus 202, where the wireless communications apparatus 202 is shown to send data through a channel. Although it is shown that the wireless communications apparatus 202 sends data, the wireless communications apparatus 202 may further receive data through a channel (for example, the wireless communications apparatus 202 may simultaneously send and receive data, the wireless communications apparatus 202 may send and receive data at different moments, or a combination thereof). The wireless communications apparatus 202 may be, for example, a base station (for example, the base station 102 in FIG. 1) or an access terminal (for example, the access terminal 116 in FIG. 1 or the access terminal 122 in FIG. 1).

The wireless communications apparatus 202 may include a polar code encoder 204, a rate matching apparatus 205, and a transmitter 206.

The polar code encoder 204 is configured to encode to-be-transferred data to obtain a corresponding polar code.

The rate matching apparatus 205 performs bit reversal order (BRO, Bit Reversal Order) interleaving on the polar code output by the polar code encoder 204, to obtain interleaved bits; and determines, based the interleaved bits, a rate-matched output sequence.

The transmitter 206 may subsequently transfer, on a channel, the rate-matched output sequence that is processed by the rate matching apparatus 205. For example, the transmitter 206 may send related data to another different wireless communications apparatus (which is not shown).

Figure 3:
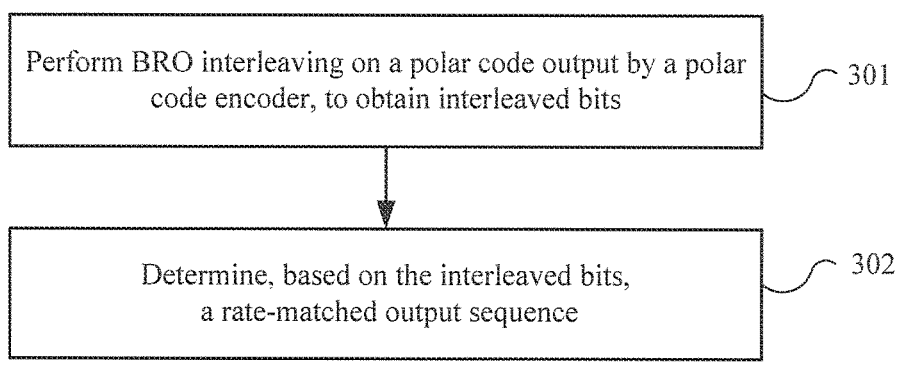
FIG. 3 is a flowchart of a polar code rate matching method according to an embodiment of the present invention.

FIG. 3 is a flowchart of a polar code rate matching method according to an embodiment of the present invention. The method in FIG. 3 is executed by a polar code encoding and transmitting end (for example, the rate matching apparatus 205 in FIG. 2).

301: Perform BRO interleaving on a polar code output by a polar code encoder, to obtain interleaved bits.

302: Determine, based on the interleaved bits, a rate-matched output sequence.

According to this embodiment of the present invention, bit reversal order interleaving is performed on a polar code, to obtain a rate-matched output sequence, which can reduce an FER, thereby improving HARQ performance and ensuring reliability of data transmission.

Optionally, in an embodiment, in step 301, a BRO interleaver may be used to perform an interleaving operation. Assuming that a length of input bits of the BRO interleaver is N, the BRO interleaver maps the $i^{th}$ input bit onto the $\Pi(i+\Delta \bmod N)^{th}$ output bit, where i=0, 1, . . . , and N−1, and herein, $\Delta$ is an offset and may be a constant, for example, 0 or another value, and mod is a modulo operation.

$\Pi(i)$ may be obtained from $BRO_M(j)$, where $BRO_M(j)$ indicates that a bit reversal order operation s performed on an index j, and M is a positive integer, and indicates a size of the interleaver. In an embodiment, a value of M may be $\log_2(N)$. However, a specific value of M is not limited in this embodiment of the present invention.

$BRO_M(j)$ may be obtained in the following manner: (1) representing j as a binary number $(b_0, b_1, \ldots, b_s)$; (2) performing order reversing on the binary number to obtain $(b_s, b_{s-1}, \ldots, b_1, b_0)$; and (3) converting the binary number obtained after order reversing into a decimal number, where the decimal number is a value of $BRO_M(j)$.

Optionally, in another embodiment, $\Pi(i)$ is defined as follows:

$\Pi_B(j) = BRO_M(j)$, where j=0, 1, . . . , and B−1, and B indicates a size of $\Pi_B(j)$.

Optionally, in another embodiment, $\Pi(i)$ may be obtained by means of pruning (prune) by $\Pi_B(j)$; and $\Pi_B(j) = 2^M(j \bmod J) + BRO_M(\lfloor j/J \rfloor)$, where j=0, 1, . . . , B−1, B indicates a size of the interleaver $\Pi_B(j)$, B=M×J, and J is a positive integer.

A pruning process refers to pruning some elements when a set condition is satisfied.

For example, when B>N, an element whose bit sequence number j is greater than N−1 may be pruned.

Optionally, in another embodiment, in step 203, when the rate-matched output sequence is determined based on the interleaved bits, a circular buffer (Circular Buffer) may be used. Specifically, the interleaved bits or reversed bits of the interleaved bits may be written into the circular buffer; a start location of the rate-matched output sequence in the circular buffer is determined according to a redundancy version (RV, Redundancy Version); and then the rate-matched output sequence is read from the circular buffer according to the start location.

The reversed bits of the interleaved bits refer to bits obtained by performing an order-reversing operation on the interleaved bits. Specifically, assuming that interleaved bits are $\{a_0, a_1, \ldots, a_{N-1}\}$, reversed bits of the interleaved bits are $\{a_{N-1}, a_{N-2}, \ldots, a_1, a_0\}$.

Optionally, in another embodiment, in step 203, when the rate-matched output sequence is determined based on the interleaved bits, the interleaved bits or reversed bits of the interleaved bits may be sequentially intercepted to obtain the rate-matched output sequence; or the interleaved bits or reversed bits of the interleaved bits may be repeatedly extracted to obtain the rate-matched output sequence.

For example, when a length La of bits that need to be retransmitted is shorter than a length Lb of the interleaved bits or the reversed bits, some bits whose length is La may be intercepted from the interleaved bits or the reversed bits, and are used as the rate-matched output sequence. For another example, when a length La of bits that need to be retransmitted is longer than a length Lb of the interleaved bits or the reversed bits, after all bits of the interleaved bits or the reversed bits are read, the bits of the interleaved bits or the reversed bits may be read again from the beginning, which is repeated until the rate-matched output sequence whose length is La is read.

According to this embodiment of the present invention, bit reversal order interleaving is performed on a polar code, to obtain a rate-matched output sequence, which can reduce an FER, thereby improving HARQ performance and ensuring reliability of data transmission.

Figure 4:
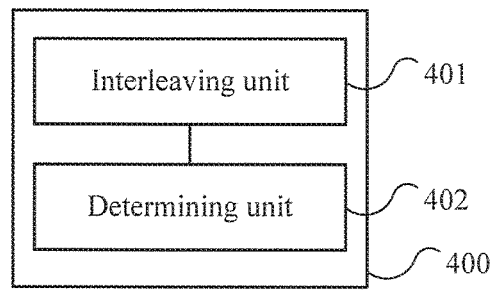
FIG. 4 is a block diagram of a rate matching apparatus according to an embodiment of the present invention.

FIG. 4 is a block diagram of a rate matching apparatus according to an embodiment of the present invention. The rate matching apparatus 400 in FIG. 4 may be located on a base station or user equipment, and includes a BRO interleaving unit 401 and a determining unit 402.

The BRO interleaving unit 401 performs BRO interleaving on a polar code output by a polar code encoder, to obtain interleaved bits. The determining unit 402 determines, based on the interleaved bits, a rate-matched output sequence.

According to this embodiment of the present invention, bit reversal order interleaving is performed on a polar code, to obtain a rate-matched output sequence, which can reduce an FER, thereby improving HARQ performance and ensuring reliability of data transmission.

Optionally, in an embodiment, a length of input bits of the BRO interleaving unit is N, and the BRO interleaving unit maps the $i^{th}$ input bit onto the $\Pi(i+\Delta \bmod N)^{th}$ output bit, where i=0, 1, . . . , and N−1, $\Delta$ is an offset, $\Pi(i)$ is obtained from $BRO_M(j)$, $BRO_M(j)$ indicates that a bit reversal order operation is performed on an index j, and M is a positive integer.

$BRO_M(j)$ may be obtained in the following manner: (1) representing j as a binary number $(b_0, b_1, \ldots, b_s)$; (2) performing order reversing on the binary number to obtain $(b_s, b_{s-1}, \ldots, b_1, b_0)$; and (3) converting the binary number obtained after order reversing into a decimal number, where the decimal number is a value of $BRO_M(j)$.

Optionally, in another embodiment, $\Pi(i)$ is defined as follows:

$\Pi_B(j) = BRO_M(j)$, where j=0, 1, . . . , and B−1, and B indicates a size of $\Pi_B(j)$.

Optionally, in another embodiment, $\Pi(i)$ may be obtained by means of pruning (prune) by $\Pi_B(j)$; and $\Pi_B(j) = 2^M(j \bmod J) + BRO_M(\lfloor j/J \rfloor)$, where j=0, 1, . . . , B−1, B indicates a size of the interleaver $\Pi_B(j)$, B=M×J, and J is a positive integer.

A pruning process refers to pruning some elements when a set condition is satisfied.

For example, when B>N, an element whose bit sequence number j is greater than N−1 may be pruned.

Optionally, in another embodiment, the determining unit 402 may use a circular buffer. Specifically, the determining unit 402 may write the interleaved bits or reversed bits of the interleaved bits into the circular buffer; determine a start location of the rate-matched output sequence in the circular buffer according to a redundancy version; and read the rate-matched output sequence from the circular buffer according to the start location.

Optionally, in another embodiment, the determining unit 402 may sequentially intercept the interleaved bits or reversed bits of the interleaved bits to obtain the rate-matched output sequence; or repeatedly extract the interleaved bits or reversed bits of the interleaved bits to obtain the rate-matched output sequence.

Figure 5:
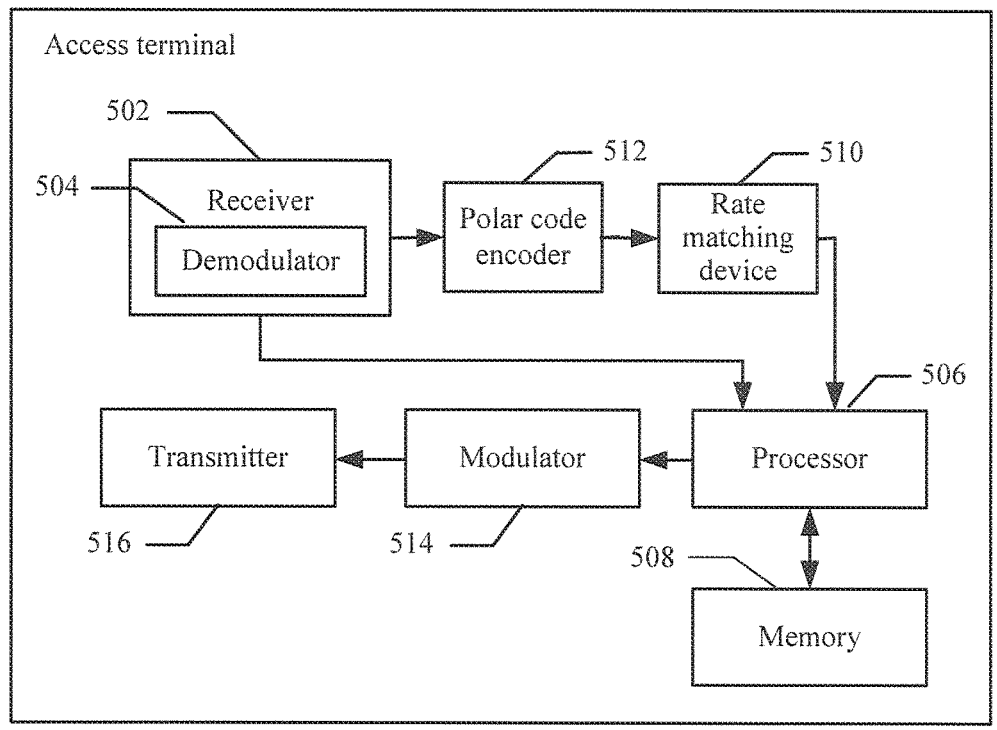
FIG. 5 is a schematic diagram of an access terminal that helps execute a polar code processing method in a wireless communications system.

FIG. 5 is a schematic diagram of an access terminal 500 that helps execute the foregoing polar code processing method in a wireless communications system. The access terminal 500 includes a receiver 502. The receiver 502 is configured to: receive a signal from, for example, a receive antenna (which is not shown), perform a typical action (for example, filtering, amplification, or down-conversion) on the received signal, and digitize an adjusted signal to obtain a sample. The receiver 502 may be, for example, an MMSE (minimum mean square error, Minimum Mean-Squared Error) receiver. The access terminal 500 may further include a demodulator 504, where the demodulator 504 may be configured to demodulate received symbols and provide the received symbols to a processor 506 for channel estimation. The processor 506 may be a processor that is dedicatedly configured to analyze information received by the receiver 502 and/or generate information to be sent by a transmitter 516, a processor that is configured to control one or more components of the access terminal 500, and/or a controller that is configured to analyze information received by the receiver 502, generate information to be sent by a transmitter 516, and control one or more components of the access terminal 500.

The access terminal 500 may additionally include a memory 508, where the memory 508 is operationally coupled to the processor 506, and stores the following data: data to be sent, received data, and any other proper information related to execution of various operations and functions described in this specification. The memory 508 may additionally store a protocol and/or an algorithm related to polar code processing.

It can be understood that a data storage apparatus (for example, the memory 508) described in this specification may be a volatile memory or a nonvolatile memory, or may include both a volatile memory and a nonvolatile memory. It is exemplary rather than limitative that the nonvolatile memory may include: a ROM (Read-Only Memory, read-only memory), a PROM (Programmable ROM, programmable read-only memory), an EPROM (Erasable PROM, erasable programmable read-only memory), an EEPROM (Electrically EPROM, electrically erasable programmable read-only memory), or a flash memory. The volatile memory may include a RAM (Random Access Memory, random access memory), and is used as an external cache. It is exemplarily rather than limitatively noted that RAMs in many forms can be used, for example, an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchlink dynamic random access memory), and a DR RAM (Direct Rambus RAM, Direct Rambus random access memory). The memory 508 in the system and method described in this specification is intended to include, but is not limited to, these memories and any other memory of a proper type.

In an actual application, the receiver 502 may be further coupled to a rate matching device 510. The rate matching device 510 may be basically similar to the rate matching apparatus 205 in FIG. 2. In addition, the access terminal 500 may further include a polar code encoder 512. The polar code encoder 512 is basically similar to the polar code encoder 204 in FIG. 2.

According to an aspect of this embodiment of the present invention, the rate matching apparatus 510 may perform BRO interleaving on a polar code output by the polar code encoder 512, to obtain interleaved bits, and determine, based on the interleaved bits, a rate-matched output sequence.

According to this embodiment of the present invention, bit reversal order interleaving is performed on a polar code, to obtain a rate-matched output sequence, which can reduce an FER, thereby improving HARQ performance and ensuring reliability of data transmission.

Optionally, in an embodiment, the rate matching device 510 may use a BRO interleaver to perform an interleaving operation. Assuming that a length of input bits of the BRO interleaver is N, the BRO interleaver maps the $i^{th}$ input bit onto the $\Pi(i+\Delta \bmod N)^{th}$ output bit, where i=0, 1, . . . , and N−1, and herein, A is an offset and may be a constant, for example, 0 or another value.

$\Pi(i)$ may be obtained from $BRO_M(j)$, where $BRO_M(j)$ indicates that a bit reversal order operation s performed on an index j, and M is a positive integer. In an embodiment, a value of M may be $\log_2(N)$. However, a specific value of M is not limited in this embodiment of the present invention.

$BRO_M(j)$ may be obtained in the following manner: (1) representing j as a binary number $(b_0, b_1, \ldots, bs)$; (2) performing order reversing on the binary number to obtain $(b_s, b_{s-1}, \ldots, b_1, b_0)$; and (3) converting the binary number obtained after order reversing into a decimal number, where the decimal number is a value of $BRO_M(j)$.

Optionally, in another embodiment, $\Pi(i)$ is defined as follows:

$\Pi_B(j)=BRO_M(j)$, where j=0, 1, . . . , and B−1, and B indicates a size of $\Pi_B(j)$.

Optionally, in another embodiment, $\Pi(i)$ may be obtained by means of pruning (prune) by $\Pi_B(j)$; and $\Pi_B(j)=2^M(j \bmod J)+BRO_M(\lfloor j/J \rfloor)$, where j=0, 1, . . . , B−1, B indicates a size of the interleaver $\Pi_B(j)$, B=M×J, and J is a positive integer.

A pruning process refers to pruning some elements when a set condition is satisfied.

For example, when B>N, an element whose bit sequence number j is greater than N−1 may be pruned.

Optionally, in another embodiment, when determining, based on the interleaved bits, the rate-matched output sequence, the rate matching device 510 may use a circular buffer (Circular Buffer). Specifically, the interleaved bits or reversed bits of the interleaved bits may be written into the circular buffer; a start location of the rate-matched output sequence in the circular buffer is determined according to a redundancy version (RV, Redundancy Version); and then the rate-matched output sequence is read from the circular buffer according to the start location.

The reversed bits of the interleaved bits refer to bits obtained by performing an order-reversing operation on the interleaved bits. Specifically, assuming that interleaved bits are $\{a_0, a_1, \ldots, a_{N-1}\}$, reversed bits of the interleaved bits are $\{a_{N-1}, a_{N-2} \ldots, a_1, a_0\}$.

Optionally, in another embodiment, when determining, based on the interleaved bits, the rate-matched output sequence, the rate matching device 510 may sequentially intercept the interleaved bits or reversed bits of the interleaved bits to obtain the rate-matched output sequence; or may repeatedly extract the interleaved bits or reversed bits of the interleaved bits to obtain the rate-matched output sequence.

For example, when a length La of bits that need to be retransmitted is shorter than a length Lb of the interleaved bits or the reversed bits, some bits whose length is La may be intercepted from the interleaved bits or the reversed bits, and are used as the rate-matched output sequence. For another example, when a length La of bits that need to be retransmitted is longer than a length Lb of the interleaved bits or the reversed bits, after all bits of the interleaved bits or the reversed bits are read, the bits of the interleaved bits or the reversed bits may be read again from the beginning, which is repeated until the rate-matched output sequence whose length is La is read.

According to this embodiment of the present invention, bit reversal order interleaving is performed on a polar code, to obtain a rate-matched output sequence, which can reduce an FER, thereby improving HARQ performance and ensuring reliability of data transmission.

In addition, the access terminal 500 may further include a modulator 514 and the transmitter 516. The transmitter 516 is configured to send a signal to, for example, a base station or another access terminal. Although it is shown that the polar code encoder 512, the rate matching device 510, and/or the modulator 514 is separated from the processor 506, it may be understood that the polar code encoder 512, the rate matching device 510, and/or the modulator 514 may be a part of the processor 506 or multiple processors (which are not shown).

Figure 6:
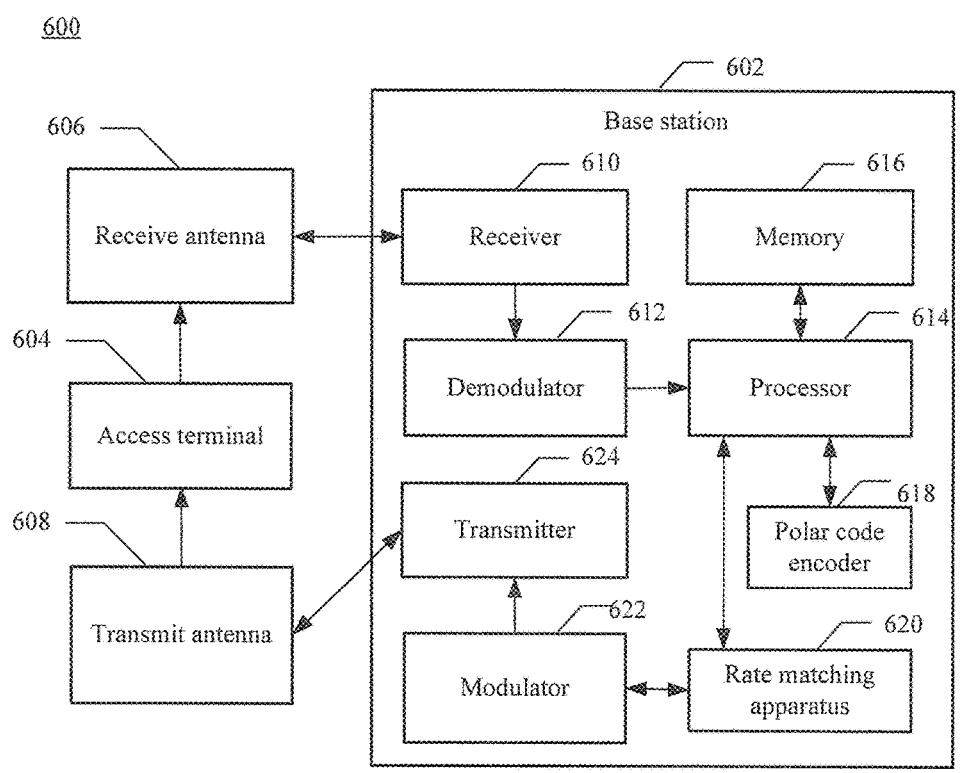
FIG. 6 is a schematic diagram of a system in which a polar code processing method is executed in a wireless communications environment.

FIG. 6 is a schematic diagram of a system 600 in which the foregoing polar code processing method is executed in a wireless communications environment. The system 600 includes a base station 602 (for example, an access point, a NodeB, or an eNB). The base station 602 has a receiver 610 that receives a signal from one or more access terminals 604 by using multiple receive antennas 606, and a transmitter 624 that transmits a signal to the one or more access terminals 604 by using a transmit antenna 608. The receiver 610 may receive information from the receive antenna 606, and is operationally associated to a demodulator 612 that demodulates the received information. A symbol obtained after demodulation is analyzed by using a processor 614 similar to the processor described in FIG. 7. The processor 614 is connected to a memory 616. The memory 616 is configured to store data to be sent to the access terminal 604 (or a different base station (which is not shown)) or data received from the access terminal 604 (or a different base station (which is not shown)), and/or any other proper information related to execution of actions and functions described in this specification. The processor 614 may be further coupled to a polar code encoder 618 and a rate matching apparatus 620.

According to an aspect of this embodiment of the present invention, the rate matching apparatus 620 may perform BRO interleaving on a polar code output by the polar code encoder 618, to obtain interleaved bits, and determine, based on the interleaved bits, a rate-matched output sequence.

According to this embodiment of the present invention, bit reversal order interleaving is performed on a polar code, to obtain a rate-matched output sequence, which can reduce an FER, thereby improving HARQ performance and ensuring reliability of data transmission.

Optionally, in an embodiment, the rate matching device 620 may use a BRO interleaver to perform an interleaving operation. Assuming that a length of input bits of the BRO interleaver is N, the BRO interleaver maps the $i^{th}$ input bit onto the $\Pi(i+\Delta \bmod N)^{th}$ output bit, where $i=0, 1, \ldots,$ and $N-1$, and herein, $\Delta$ is an offset and may be a constant, for example, 0 or another value.

$\Pi(i)$ may be obtained from $BRO_M(j)$, where $BRO_M(j)$ indicates that a bit reversal order operation s performed on an index j, and M is a positive integer. In an embodiment, a value of M may be $\log_2(N)$. However, a specific value of M is not limited in this embodiment of the present invention.

$BRO_M(j)$ may be obtained in the following manner: (1) representing j as a binary number $(b_0, b_1, \ldots, b_s)$; (2) performing order reversing on the binary number to obtain $(b_s, b_{s-1}, \ldots, b_1, b_0)$; and (3) converting the binary number obtained after order reversing into a decimal number, where the decimal number is a value of $BRO_M(j)$.

Optionally, in another embodiment, $\Pi(i)$ is defined as follows:

$\Pi_B(j) = BRO_M(j)$, where $j=0, 1, \ldots,$ and B−1, and B indicates a size of $\Pi_B(j)$.

Optionally, in another embodiment, $\Pi(i)$ may be obtained by means of pruning (prune) by $\Pi_B(j)$; and $\Pi_B(j) = 2^M(j \bmod J) + BRO_M(\lfloor j/J \rfloor)$, where $j=0, 1, \ldots,$ B−1, B indicates a size of the interleaver $\Pi_B(j)$, $B = M \times J$, and J is a positive integer.

A pruning process refers to pruning some elements when a set condition is satisfied.

For example, when B>N, an element whose bit sequence number j is greater than N−1 may be pruned.

Optionally, in another embodiment, when determining, based on the interleaved bits, the rate-matched output sequence, the rate matching device 620 may use a circular buffer (Circular Buffer) Specifically, the interleaved bits or reversed bits of the interleaved bits may be written into the circular buffer; a start location of the rate-matched output sequence in the circular buffer is determined according to a redundancy version (RV, Redundancy Version); and then the rate-matched output sequence is read from the circular buffer according to the start location.

The reversed bits of the interleaved bits refer to bits obtained by performing an order-reversing operation on the interleaved bits. Specifically, assuming that interleaved bits are $\{a_0, a_1, \ldots, a_{N-1}\}$, reversed bits of the interleaved bits are $\{a_{N-1}, a_{N-2}, \ldots, a_1, a_0\}$.

Optionally, in another embodiment, when determining, based on the interleaved bits, the rate-matched output sequence, the rate matching device 620 may sequentially intercept the interleaved bits or reversed bits of the interleaved bits to obtain the rate-matched output sequence; or may repeatedly extract the interleaved bits or reversed bits of the interleaved bits to obtain the rate-matched output sequence.

For example, when a length La of bits that need to be retransmitted is shorter than a length Lb of the interleaved bits or the reversed bits, some bits whose length is La may be intercepted from the interleaved bits or the reversed bits, and are used as the rate-matched output sequence. For another example, when a length La of bits that need to be retransmitted is longer than a length Lb of the interleaved bits or the reversed bits, after all bits of the interleaved bits or the reversed bits are read, the bits of the interleaved bits or the reversed bits may be read again from the beginning, which is repeated until the rate-matched output sequence whose length is La is read.

According to this embodiment of the present invention, bit reversal order interleaving is performed on a polar code, to obtain a rate-matched output sequence, which can reduce an FER, thereby improving HARQ performance and ensuring reliability of data transmission.

In addition, in the system 600, a modulator 622 may multiplex a frame, so that the transmitter 624 sends information to the access terminal 604 by using the antenna 608. Although it is shown that the polar code encoder 618, the rate matching apparatus 620, and/or the modulator 622 is separated from the processor 614, it may be understood that the polar code encoder 618, the rate matching apparatus 620, and/or the modulator 622 may be a part of the processor 614 or multiple processors (which are not shown).

It may be understood that the embodiments described in this specification may be implemented by hardware, software, firmware, middleware, microcode, or a combination thereof. For implementation by hardware, a processing unit may be implemented in one or more ASICs (Application Specific Integrated Circuits, application specific integrated circuits), DSPs (Digital Signal Processing), DSPDs (DSP Device), PLDs (Programmable Logic Device, programmable logic devices), FPGAs (Field-Programmable Gate Array, field-programmable gate arrays), processors, controllers, micro-controllers, microprocessors, other electronic units used for performing the functions in this application, or a combination thereof.

When the embodiments are implemented in software, firmware, middleware, microcode, program code, or a code segment, the software, the firmware, the middleware, the microcode, the program code, or the code segment may be stored in, for example, a machine-readable medium of a storage component. The code segment may indicate a process, a function, a subprogram, a program, a routine, a subroutine, a module, a software group, a class, or any combination of an instruction, a data structure, or a program statement. The code segment may be coupled to another code segment or a hardware circuit by transferring and/or receiving information, data, an independent variable, a parameter, or memory content. The information, the independent variable, the parameter, the data, or the like may be transferred, forwarded, or sent in any proper manner such as memory sharing, message transfer, token transfer, or network transmission.

For implementation by software, the technologies in this specification may be implemented by using modules (for example, a process and a function) for executing the functions in this specification. Software code may be stored in a memory unit and executed by a processor. The memory unit may be implemented inside the processor or outside the processor, and in a latter case, the memory unit may be coupled to the processor by means of communication by using various means known in the art.

Figure 7:
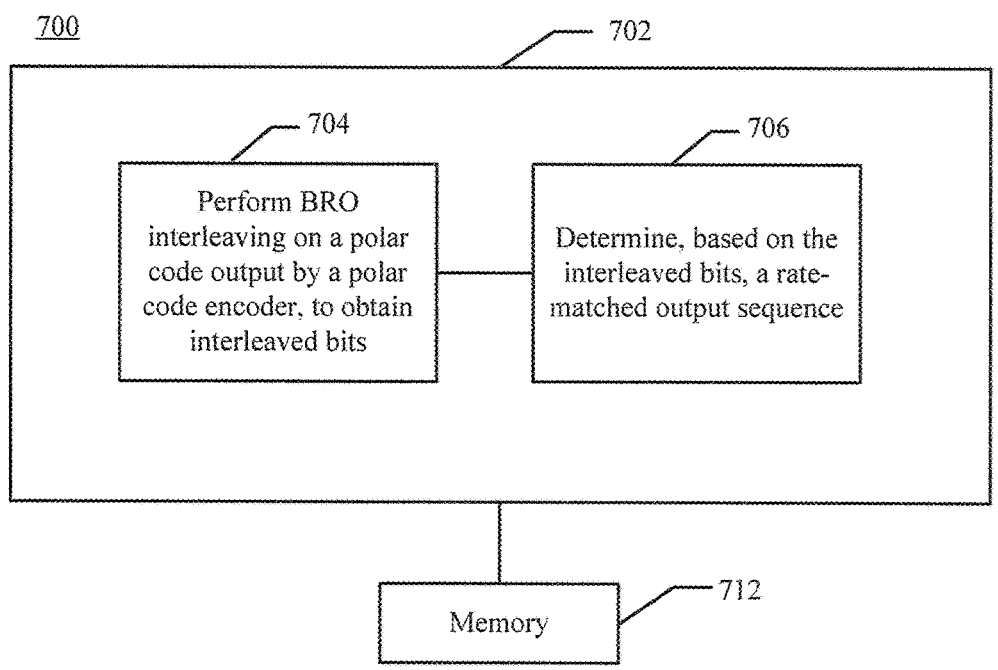
FIG. 7 shows a system in which a polar code rate matching method can be used in a wireless communications environment.

Referring to FIG. 7, FIG. 7 shows a system 700 in which a polar code rate matching method can be used in a wireless communications environment. For example, the system 700 may at least partially reside in a base station. According to another example, the system 700 may at least partially reside in an access terminal. It should be understood that the system 700 may be represented as including a functional block, which may be a functional block representing a function implemented by a processor, software, or a combination thereof (for example, firmware). The system 700 includes a logic group 702 having electronic components that jointly perform an operation.

For example, the logic group 702 may include an electronic component 704 that is configured to perform BRO interleaving on a polar code output by a polar code encoder, to obtain interleaved bits. The logic group 702 may further include an electronic component 706 that is configured to determine, based on the interleaved bits, a rate-matched output sequence.

According to this embodiment of the present invention, bit reversal order interleaving is performed on a polar code, to obtain a rate-matched output sequence, which can reduce an FER, thereby improving HARQ performance and ensuring reliability of data transmission.

In addition, the system 700 may include a memory 712. The memory 712 stores instructions used for performing functions related to the electronic components 7046 and 706. Although it is shown that the electronic components 704 and 706 are outside the memory 712, it may be understood that one or more of the electronic components 704 and 706 may exist inside the memory 712.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and no further details are provided herein.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one location, or may be distributed on multiple network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code rate matching method, comprising:
performing, by a rate matching apparatus, bit reversal order (BRO) interleaving on a polar code, to obtain interleaved bits, a length of input bits of the rate matching apparatus is N, wherein N is a positive integer;
mapping, by the rate matching apparatus, an $i^{th}$ input bit onto a $\Pi(i+\Delta \bmod N)^{th}$ output bit, wherein i=0, 1, . . . , and N−1, $\Delta$ is an offset, $\Pi(i)$ is obtained from $BRO_M(j)$, wherein the $BRO_M(j)$ indicates that a bit reversal order operation is performed on an index j, and M is a positive integer indicating a size of $BRO_M(j)$;
determining, by the rate matching apparatus, based on the interleaved bits, a rate-matched output sequence;
arranging, by the rate matching apparatus, the interleaved bits into the rate-matched output sequence to produce a rate-matched output sequence of bits; and
transmitting, by the rate matching apparatus, the rate-matched output sequence of bits.

2. The method according to claim 1, wherein:
$\Pi(i)$ is defined as follows: $\Pi_B(j)=BRO_M(j)$, wherein j=0, 1 . . . , and B−1, and B indicates a size of $\Pi_B(j)$.

3. The method according to claim 1, wherein:
$\Pi(i)$ is obtained by means of pruning by $\Pi_B(j)$; and
$\Pi_B(j)=2^M(j \bmod J)+BRO_M(\lfloor j/J \rfloor)$, wherein
j=0, 1, . . . , B−1, B indicates a size of the rate matching apparatus $\Pi_B()$ B=M×J, and J is a positive integer.

4. The method according to claim 1, wherein determining, based on the interleaved bits, a rate-matched output sequence comprises:
writing the interleaved bits or reversed bits of the interleaved bits into a circular buffer;
determining a start location of the rate-matched output sequence in the circular buffer according to a redundancy version; and
reading the rate-matched output sequence from the circular buffer according to the start location.

5. The method according to claim 1, wherein determining, based on the interleaved bits, a rate-matched output sequence comprises:
sequentially intercepting the interleaved bits or reversed bits of the interleaved bits to obtain the rate-matched output sequence; or
repeatedly extracting the interleaved bits or reversed bits of the interleaved bits to obtain the rate-matched output sequence.

6. A wireless communications apparatus, comprising:
a polar code encoder;
a rate matching apparatus, configured to:
perform BRO interleaving on a polar code output by the polar code encoder, to obtain interleaved bits and map an $i^{th}$ input bit onto a $\Pi(i+\Delta \bmod N)^{th}$ output bit, wherein i=0, 1, . . . , and N−1, $\Delta$ is an offset, $\Pi(i)$ is obtained from $BRO_M(j)$, $BRO_M(j)$ indicates that a bit reversal order operation is performed on an index j, and M is a positive integer indicating a size of $BRO_M(j)$, a length of input bits of the rate matching apparatus is N,
determine, based on the interleaved bits, a rate-matched output sequence, and
arrange the interleaved bits into the rate-matched output sequence to produce a rate-matched output sequence of bits; and
a transmitter, configured to transmit the rate-matched output sequence of bits.

7. The wireless communications apparatus according to claim 6, wherein the rate matching apparatus is configured to:
write the interleaved bits or reversed bits of the interleaved bits into a circular buffer;
determine a start location of the rate-matched output sequence in the circular buffer according to a redundancy version; and
read the rate-matched output sequence from the circular buffer according to the start location.

8. The wireless communications apparatus according to claim 6, wherein the rate matching apparatus is configured to:
sequentially intercept the interleaved bits or reversed bits of the interleaved bits to obtain the rate-matched output sequence; or
repeatedly extract the interleaved bits or reversed bits of the interleaved bits to obtain the rate-matched output sequence.

9. An apparatus for interleaving, comprising:
a bit reversal order (BRO) interleaver processor, configured to perform BRO interleaving on a polar code output by a polar code encoder, to obtain interleaved bits, and map an $i^{th}$ input bit onto a $\Pi(i+\Delta \bmod N)^{th}$ output bit, wherein i=0, 1, . . . , and N−1, $\Delta$ is an offset, $\Pi(i)$ is obtained from $BRO_M(j)$, $BRO_M(j)$ indicates that a bit reversal order operation is performed on an index j, and M is a positive integer indicating a size of $BRO_M(j)$, a length of input bits of the BRO interleaver is N;
a circular buffer, configured to store the interleaved bits or reversed bits of the interleaved bits; and
a transmitter, configured to transmit the interleaved bits or reversed bits.

10. The apparatus for interleaving according to claim 9, wherein:
$\Pi(i)$ is defined as follows: $\Pi_B(j)=BRO_M(j)$, wherein j=0, 1, . . . , and B−1, and B indicates a size of $\Pi_B(j)$.

11. The apparatus for interleaving according to claim 9, wherein:
$\Pi(i)$ is obtained by means of pruning by $\Pi_B(j)$; and
$\Pi_B(j)=2^M(j \bmod J)+BRO_M(\lfloor j/J \rfloor)$, wherein
j=0, 1, . . . , B−1, B indicates a size of the interleaver $\Pi_B(j)$, B=M×J, and J is a positive integer.

* * * * *